(12) United States Patent
Ohta

(10) Patent No.: US 6,339,880 B1
(45) Date of Patent: Jan. 22, 2002

(54) PROCESS FOR MANUFACTURING HEAT SINK

(75) Inventor: Keiichiro Ohta, Oyama (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/669,718

(22) Filed: Sep. 26, 2000

(30) Foreign Application Priority Data

Sep. 28, 1999 (JP) .......................................... 11-273542

(51) Int. Cl.$^7$ ................................................ B23P 15/26
(52) U.S. Cl. .................................. 29/890.03; 29/890.05
(58) Field of Search ..................... 29/890.03, 890.05, 29/557, 558; 72/254; 165/185

(56) References Cited

U.S. PATENT DOCUMENTS

| | | | |
|---|---|---|---|
| 3,692,105 A | * 9/1972 | O'Connor ................ | 29/890.03 |
| 4,203,311 A | * 5/1980 | O'Connor et al. ........ | 29/890.05 |
| 4,369,838 A | 1/1983 | Asanuma et al. | |
| 4,879,891 A | * 11/1989 | Hinshaw ...................... | 72/254 |
| 5,054,548 A | * 10/1991 | Zohler ..................... | 29/890.03 |
| 5,774,964 A | * 7/1998 | Fisher et al. .................. | 29/558 |
| 5,937,517 A | * 8/1999 | Smith et al. ............. | 29/890.03 |
| 6,032,730 A | * 3/2000 | Akita et al. ............... | 29/890.03 |
| 6,138,488 A | * 10/2000 | Lee ............................. | 72/254 |

FOREIGN PATENT DOCUMENTS

| | | |
|---|---|---|
| DE | 2239 069 | 2/1973 |
| JP | 62-203630 | 9/1987 |
| JP | 6-232300 | 8/1994 |

\* cited by examiner

Primary Examiner—I Cuda-Rosenbaum
(74) Attorney, Agent, or Firm—Armstrong, Westerman, Hattori, McLeland & Naughton, LLP

(57) ABSTRACT

In a process for manufacturing a heat sink comprising a heat dissipating base plate and a multiplicity of tonguelike fins formed on an upper surface of the base plate, a heat sink blank of aluminum extrudate is formed which has a part for forming a thick portion of the base plate, a fin forming portion provided on an upper side of the thick portion forming part integrally therewith, a thin portion of the base plate provided at at least one of opposite sides of the thick portion forming part, and a level reference ridge formed on an upper surface of the thin portion and having an upper end at the same level as an upper surface of the thick portion to be formed. The fin forming portion of the blank is cut to a raised form at the same level as the level of the upper end of the reference ridge to form a multiplicity of tonguelike fins and form a thick portion of predetermined thickness under the fins.

5 Claims, 2 Drawing Sheets

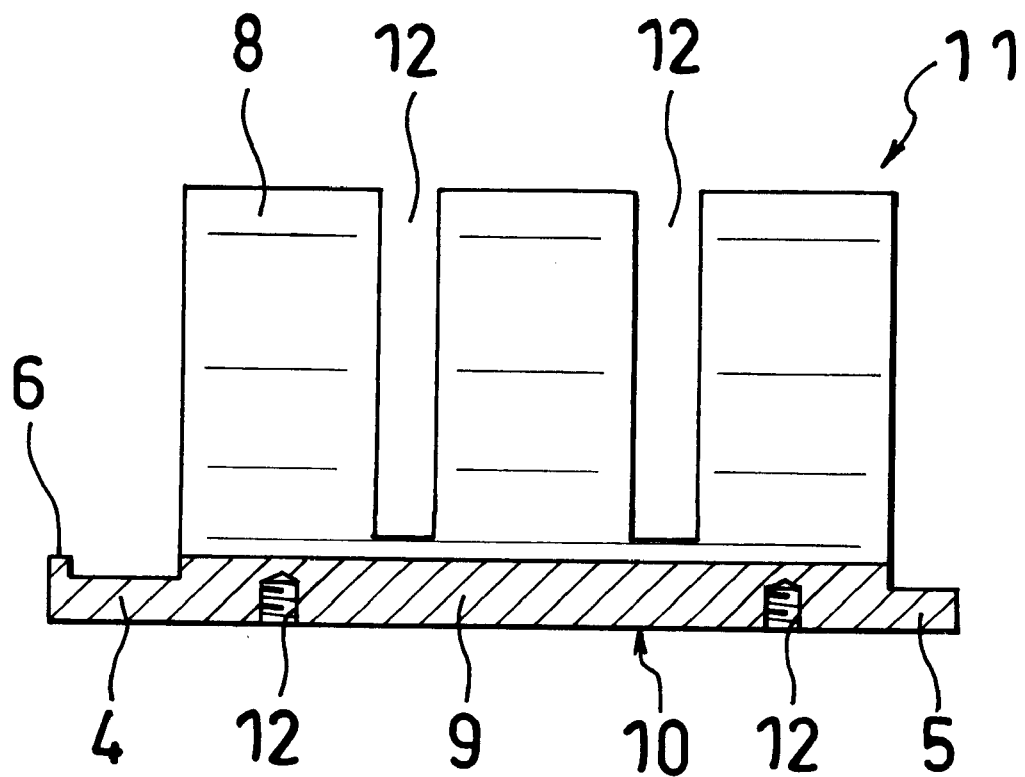

PROCESS FOR MANUFACTURING HEAT SINK

BACKGROUND OF THE INVENTION

The present invention relates to a process for manufacturing heat sinks which are to be used for semiconductor devices or like heat generating articles as attached to the heat sink or to be attached to electronic devices having a heat generating article incorporated therein for dissipating the heat generated by the article.

The term "aluminum" as used herein and in the appended claims includes pure aluminum, commercial aluminum containing traces of impurities and aluminum alloys.

Heat sinks are already known which comprise a multiplicity of tonguelike fins formed on the upper surface of a heat dissipating base plate. The base plate of the heat sink has holes, such as threaded holes, holes for driving tapping screws thereinto and bolt insertion holes, for use in attaching the article to be cooled to the base plate or attaching the heat sink itself to the device to be cooled by radiation. Although burrs are produced when the base plate is drilled, the multiplicity of tonguelike fins on the upper surface of the heat dissipating base plate present difficulty in removing the burrs completely, necessitating labor and time for deburring.

An object of the present invention is to provide a heat sink having a heat dissipating base plate in which blind holes not extending to the upper surface of the plate can be formed so as to obviate the problem with the burrs.

SUMMARY OF THE INVENTION

The present invention provides a process for manufacturing a heat sink comprising a heat dissipating base plate and a multiplicity of tonguelike fins formed on an upper surface of the base plate. In this process, a heat sink blank of aluminum extrudate is formed first which has a part for forming a thick portion of the base plate, a fin forming portion provided on an upper side of the thick portion forming part integrally therewith, a thin portion of the base plate provided at at least one of opposite sides of the thick portion forming part, and a level reference ridge formed on an upper surface of the thin portion and having an upper end at the same level as an upper surface of the thick portion to be formed. The fin forming portion of the blank is cut to raised form at the same level as the level of the upper end of the reference ridge to form a multiplicity of tonguelike fins and form a thick portion of predetermined thickness under the fins. This assures the thick portion of the accuracy of its thickness. Further if the fin forming portion of the heat sink blank is cut to excess to partly cut even the thick portion forming part beneath the fin forming portion to give the thick portion of the heat dissipating base plate a smaller thickness than the specified value, the upper portion of the level reference ridge is also cut to a raised form. This cut portion therefore readily indicates that the product is faulty.

The present invention will be described in greater detail with reference to the accompanying drawings.

BRIEF DESCRIPTION OF THE DRAWINGS

FIG. 3 is a view in cross section of the heat sink of FIG. 2 to show blind holes formed in a thick portion of a heat dissipating base plate.

DESCRIPTION OF THE PREFERRED EMBODIMENT

An embodiment of the present invention will be described below with reference to the drawings.

Figure 1:
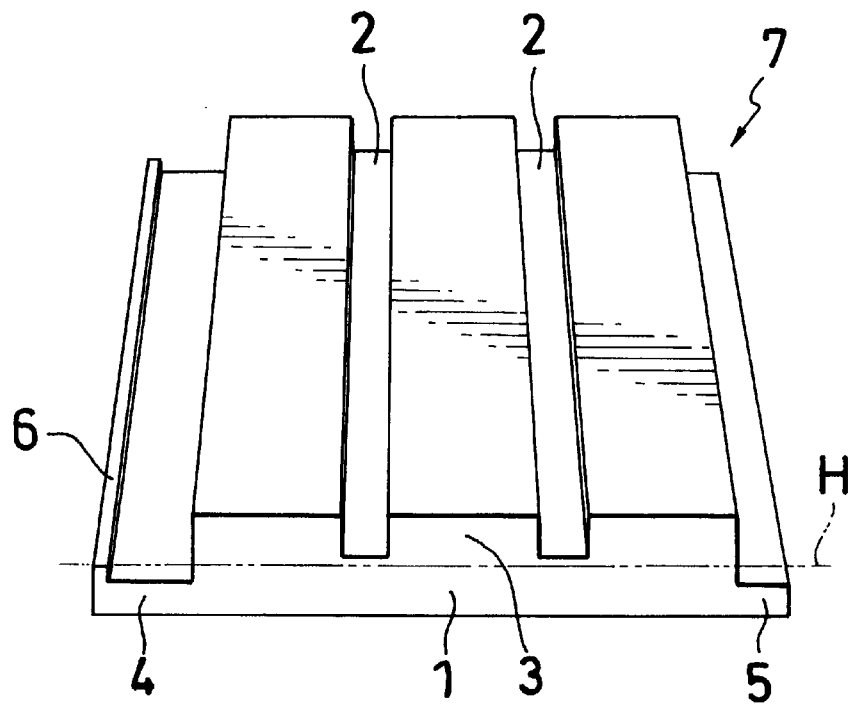
FIG. 1 is a perspective view of a heat sink blank made of aluminum extrudate and obtained by a first step of the process of the invention for manufacturing heat sinks.

As shown in FIG. 1, a heat sink blank 7 made of aluminum extrudate is first formed which has a part 1 for forming a thick portion of a heat dissipating base plate, a fin forming portion 3 provided on the upper side of the thick portion forming part 1 integrally therewith and having two grooves 2 extending longitudinally of the blank, thin portions 4, 5 of the base plate provided respectively at opposite sides of the thick portion forming part 1, and a level reference ridge 6 formed on the upper surface of one of the thin portions, 4, at an edge thereof and having an upper end at the same level as the upper surface of the thick portion to be formed. Referring to FIG. 1, the lower side of a horizontal line H through the upper end of the reference ridge 6 serves as the thick portion forming part, and the upper side of the line as the fin forming portion 3.

Figure 2:
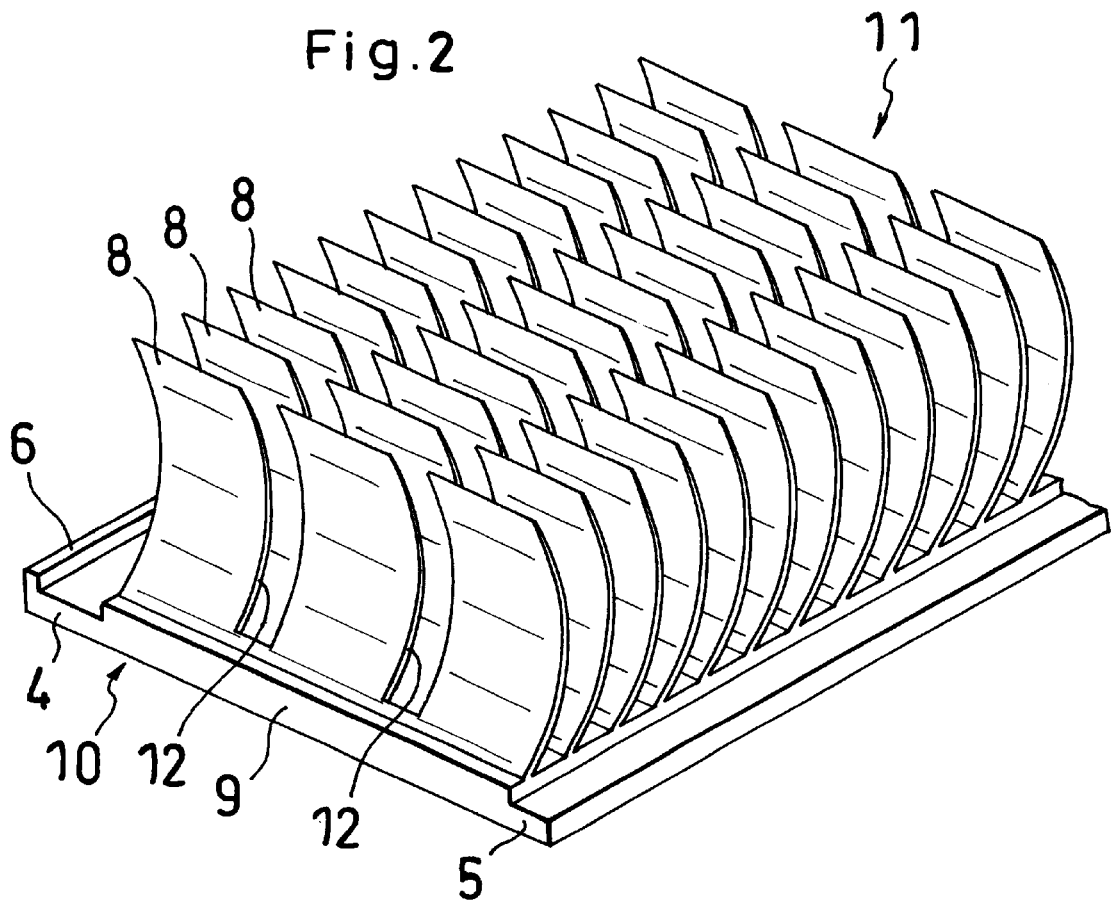
FIG. 2 is a perspective view of the heat sink fabricated according to the invention.

As shown in FIG. 2, the fin forming portion 3 of the heat sink blank 7 is cut to a raised form at the same level as the level of the upper end of the reference ridge 6, i.e., along the horizontal line H, to form a multiplicity of tonguelike fins 8 and also form a thick portion 9 of predetermined thickness under the fins. Thus, a heat dissipating base plate 10 is prepared which has the thick portion 9 and thin portions 4, 5 to obtain a heat sink 11 as a product. When the fin forming portion 3 is cut to a raised form into the multiplicity of tonguelike fins 8, the portions corresponding to the grooves 2 form slits 12 dividing each fin 8 into three segments.

If the heat dissipating base plate is thick in its entirety, the heat sink has an increased weight, whereas the presence of the thin portions 4, 5 results in a corresponding reduction in weight, further making it possible to provide the level reference ridge 6. While the ridge 6 is formed on only one thin portion 4, the ridge may be formed on each of the thin portions 4, 5.

In the case where threaded holes are to be formed in the thick portion 9 of the base plate 10 of the heat sink 11 for use in attaching a CPU or like electronic component to the heat sink, blind holes 13 are formed which extend from the lower surface of the thick portion 9 to a position close to the upper surface thereof as shown in FIG. 3. The thick portion 9 has such a predetermined thickness that the blind holes 13 can be formed therein.

What is claimed is:

1. A process for manufacturing a heat sink comprising a heat dissipating base plate and a multiplicity of tonguelike fins formed on an upper surface of the base plate, the process comprising the steps of forming a heat sink blank made of an aluminum extrudate and having a part for forming a thick portion of the base plate, a fin forming portion provided on an upper side of the thick portion forming part integrally therewith, a thin portion of the base plate provided at at least one of opposite sides of the thick portion forming part, and a level reference ridge formed on an upper surface of the thin portion and having an upper end at the same level as an upper surface of the thick portion to be formed; and cutting the fin forming portion of the heat sink blank to a raised form at the same level as the level of the upper end of the reference ridge to form a multiplicity of tonguelike fins and form a thick portion of predetermined thickness under the fins.

2. A process for manufacturing a heat sink according to claim 1 wherein the level reference ridge is positioned at an edge of the thin portion.

3. A process for manufacturing a heat sink according to claim 1 wherein at least one groove extending longitudinally of the heat sink blank is formed in the fin forming portion of the blank, and the portion corresponding to the at least one groove forms a slit dividing each of the tonguelike fins into a plurality of segments when the fins are formed by cutting the fin forming portion to the raised form.

4. A process for manufacturing a heat sink according to claim 1 wherein the thick portion has a thickness permitting formation of blind holes therein.

5. A process for manufacturing a heat sink according to claim 4 wherein the blind holes are threaded holes or holes for driving tapping screws thereinto.

* * * * *